(12) United States Patent
Minegishi et al.

(10) Patent No.: US 8,304,160 B2
(45) Date of Patent: Nov. 6, 2012

(54) PHOTOSENSITIVE RESIN COMPOSITION AND CIRCUIT FORMATION SUBSTRATE USING THE SAME

(75) Inventors: Tomonori Minegishi, Hitachi (JP); Rika Nogita, Hitachi (JP); Dai Kawasaki, Hitachi (JP); Keiko Suzuki, Hitachi (JP); Taku Konno, Hitachi (JP)

(73) Assignee: Hitachi Chemical Dupont Microsystems, Ltd., Tokyo (JP)

( * ) Notice: Subject to any disclaimer, the term of this patent is extended or adjusted under 35 U.S.C. 154(b) by 218 days.

(21) Appl. No.: 12/759,475

(22) Filed: Apr. 13, 2010

(65) Prior Publication Data

US 2010/0260983 A1   Oct. 14, 2010

(30) Foreign Application Priority Data

Apr. 14, 2009   (JP) ................. 2009-097918
Dec. 17, 2009   (JP) ................. 2009-286479

(51) Int. Cl.
  *G03F 7/00* (2006.01)
  *G03F 7/004* (2006.01)
  *G03F 7/40* (2006.01)

(52) U.S. Cl. ............. 430/270.1; 430/913; 430/311; 430/330; 430/331

(58) Field of Classification Search ........... 430/270.1, 430/913, 311, 330, 331
See application file for complete search history.

(56) References Cited

FOREIGN PATENT DOCUMENTS

| JP | 48-16620 | 3/1973 |
| JP | 10-36506 | 2/1998 |
| JP | 2000-159887 A | 6/2000 |
| JP | 2000-290372 A | 10/2000 |
| JP | 2003345012 A | * 12/2003 |
| JP | 2004085637 A | * 3/2004 |
| JP | 3712164 B2 | 11/2005 |
| JP | 2006-173655 A | 6/2006 |
| JP | 2006-328407 A | 12/2006 |
| JP | 3860359 | 12/2006 |
| JP | 2008-001876 A | 1/2008 |
| JP | 2008-1877 A | 1/2008 |
| JP | 2008-251121 A | 10/2008 |
| JP | 2008-310946 A | 12/2008 |

OTHER PUBLICATIONS

Machine translation of JP 2003-345012 (no date).*
Machine translation of JP 2004-085637 (no date).*

* cited by examiner

*Primary Examiner* — Amanda C. Walke
(74) *Attorney, Agent, or Firm* — Griffin & Szipl, P.C.

(57) ABSTRACT

A photosensitive resin composition for an interlayer insulating film or a protective film of a substrate for circuit formation, which includes a polymer (a) having a structural unit shown by the formula (A) and a compound (b) which generates a radical when irradiated with active rays and has a structure shown by the following formula (B).

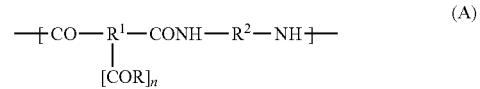

(A)

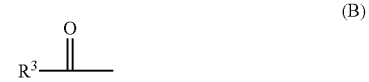

(B)

12 Claims, 3 Drawing Sheets

PHOTOSENSITIVE RESIN COMPOSITION AND CIRCUIT FORMATION SUBSTRATE USING THE SAME

This application claims priority from Japanese Patent Application No. 2009-097918, filed Apr. 14, 2009 and Japanese Patent Application No. 2009-286479, filed Dec. 17, 2009, the entire disclosures of which are incorporated herein by reference.

TECHNICAL FIELD

The invention relates to a photosensitive resin composition used for a circuit formation substrate, in particular, to a photosensitive resin composition used in a suspension for a hard disk drive which has been required to be larger in capacity or smaller in size in recent years, as well as to a method for forming a pattern and a circuit formation substrate using the same.

BACKGROUND ART

Conventionally, as a surface protection film and an interlayer insulating film of a semiconductor device, a polyimide resin which has improved heat resistance, electric properties, mechanical properties or the like in combination has been used. However, as a semiconductor device has become highly integrated and has become larger in size, there has been a demand for a thinner and smaller package for a sealed resin. Under such circumstances, a method for surface mounting such as LOC (lead-on-chip) and reflow soldering has been adapted, and the demand for a polyimide resin which is improved in mechanical properties, heat resistance or the like has become greater than ever.

A photosensitive polyimide obtained by imparting photosensitive properties with a polyimide resin itself has been used. This photosensitive polyimide has advantages that pattern formation steps can be simplified and the time required for complex production can be shortened. A heat-resistant photoresist using a conventional polyimide or its precursor and the application thereof are well known. Regarding a negative-type photoresist, a polyimide obtained by introducing a methacryloyl group into a polyimide precursor through an ester bond or an ionic bond (see JP-B-3712164, JP-A-2006-173655, JP-A-2008-1876 and JP-A-2008-1877, for example), a soluble polyimide having a photopolymerizable olefin (see JP-A-H10-36506, JP-A-2000-159887, JP-A-2000-290372, JP-A-2006-328407, JP-B-3860359 and JP-A-2006-328407, for example) and a self-sensitized polyimide having a benzophenone skeleton and an alkyl group at an ortho group of an aromatic ring to which a nitrogen atom is bonded (see JP-A-2008-251121 and JP-A-2008-310946, for example), or the like are known.

In recent years, use of such photosensitive polyimide in a circuit formation substrate on a suspension in which a magnetic head of a hard disc drive, such as those mentioned below, is mounted has attracted attention.

As for the magnetic head, in respect of an increased memory capacity, an increased speed or the like of a hard disc drive, a so-called MR-thin film composited head in which a magnetic resistive type MR (Magnetic Resistive) device and a thin film is integrated has attracted attention instead of a conventional MIG (metal-in-gap) or magnetic inductive thin film.

In contrast to a conventional head in which reading and writing of a magnetic signal is conducted simultaneously in a single head, in a MR head, writing and reading are conducted separately in a single head. As a result, the number of terminals has been doubled (if need arises, a ground terminal is added), and hence, a wire for connecting a head and a disk main body is required to be thinner.

However, a wire tends to be corroded as it is rendered thinner. In addition, troubles such as difficulty in interface with impedance and difficulty in mounting of a head tend to occur. In order to solve such new problems, a method in which a circuit is directly formed on a suspension in which a head is mounted has been proposed (see JP-A-S48-16620).

SUMMARY OF THE INVENTION

In the circuit formation substrate as mentioned above, a polyimide resin layer which has, in combination, improved heat resistance, electric properties, mechanical properties or the like is used as the interlayer insulating film or the protective layer of a circuit. However, such use of a polyimide resin layer has the following problems. Specifically, in the case where the polyimide resin layer has a high water absorbability, if such a circuit formation substrate is incorporated in a hard disc drive main body as a suspension, for example, the dimension of the substrate may vary largely due to adsorption and desorption of water to a polyimide resin layer, and as a result, the suspension itself is warped to cause the accuracy of alignment to be lowered. In addition, since the gap between the disc and the main body is changed, the device performance is deteriorated.

Further, many of polyimide resins with low water absorption contain fluorine. In addition, due to the rigid structure thereof, if the polyimide resin is rendered photosensitive, the solubility thereof in an organic solvent such as a developer is significantly low. In addition, there are problems that difference in solubility speed between an exposed part and an unexposed part which is sufficient for forming an image cannot be obtained.

The invention has been made in order to solve the above-mentioned conventional problems, and an object thereof is to provide a photosensitive resin composition which is capable of forming a good pattern improved in sensitivity and resolution and has appropriate properties as an interlayer insulating film or a protective film of a circuit formation substrate such as the above-mentioned suspension, as well as to provide a pattern formation method and a circuit formation substrate using this photosensitive resin composition.

According to the invention, the following photosensitive resin composition or the like are provided. In accordance with a first embodiment, a photosensitive resin composition for an interlayer insulating film or a protective film of a substrate for circuit formation is provided, which comprises a polymer (a) having a structural unit shown by the formula (A):

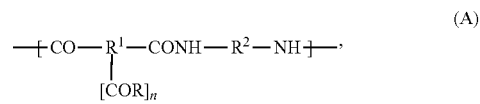

wherein $R^1$ is a trivalent or tetravalent organic group, $R^2$ is a divalent organic group, R is a monovalent organic group having a carbon-carbon unsaturated double bond or a group shown by $O^-M^+$, in which $M^+$ is a hydrogen ion or an ion of a compound having a carbon-carbon unsaturated double bond, and at least one of Rs is a monovalent organic group having a carbon-carbon unsaturated double bond or a group shown by $O^-M^+$, in which $M^+$ is an ion of a compound having a carbon-carbon unsaturated double bond, and n is 1 or 2, and a compound (b) which generates a radical when irradiated with active rays and has a structure shown by the following formula (B):

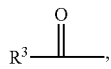
(B)

wherein $R^3$ is a monovalent aromatic or heterocyclic ring, which may have a substituent. In accordance with a second embodiment, the photosensitive resin composition according to the first embodiment, is modified so that the polymer (a) has a structural unit shown by the following formula (1):

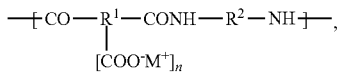
(1)

wherein $R^1$, $R^2$, $M^+$ and n are as defined in the formula (A). In accordance with a third embodiment of the invention, the first and second embodiments are further modified so that, in the structural unit shown by the formula (A), $R^2$ is a structure shown by the following formula (2) or (3):

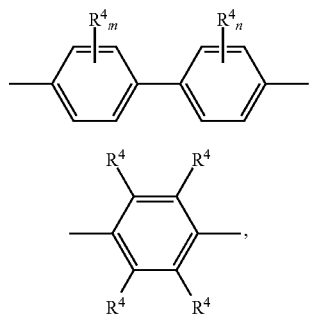
(2)

(3)

wherein a plurality of $R^4$s are independently a fluorine atom or a monovalent organic group having 1 to 10 carbon atoms, which may have an oxygen atom, a sulfur atom or a halogen atom, and m and n are independently an integer of 0 to 4. In accordance with a fourth embodiment of the present invention, the first, second and third embodiments are further modified so that, in the structural unit shown by the formula (A), $R^2$ is a structure shown by the following formula (4):

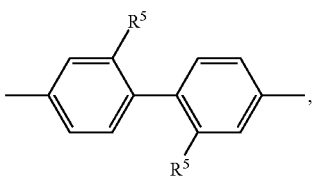
(4)

wherein $R^5$s are independently a fluorine atom or a trifluoromethyl group. In accordance with a fifth embodiment of the present invention, the first, second, third and fourth embodiments are further modified so that the compound (b) is a compound containing an oxime ester structure. In accordance with a sixth embodiment of the present invention, the fifth embodiment is modified so that the compound (b) is shown by the following formula (5):

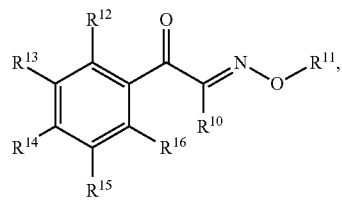
(5)

wherein $R^{10}$ to $R^{16}$ are independently a monovalent group. In accordance with a seventh embodiment of the present invention, the sixth embodiment is further modified so that the compound (b) is shown by the following compound (6).

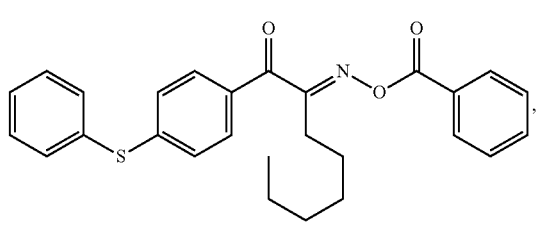
(6)

In accordance with an eighth embodiment of the present invention, the first, second, third, fourth, fifth, sixth and seventh embodiments are further modified so that the compound (b) is contained in an amount of 0.1 to 20 parts by mass relative to 100 parts by mass of the polymer (a). In accordance with a ninth embodiment of the present invention, the first, second, third, fourth, fifth, sixth, seventh and eighth embodiments of the present invention are further modified so that the substrate for circuit formation is a supporting substrate of a suspension for a hard disk drive. In accordance with a tenth embodiment of the present invention, a method for forming a pattern is provided, wherein the method includes the steps of: (i) applying the photosensitive resin composition according to any of one of the first, second, third, fourth, fifth, sixth, seventh, eighth and ninth embodiments to a substrate for circuit formation, followed by drying to form a photosensitive resin film; (ii) exposing the photosensitive resin film to light; (iii) developing the photosensitive resin film after the exposure; and (iv) heating the photosensitive resin film after the development. In accordance with an eleventh embodiment of the present invention, a circuit formation substrate is provided that comprises, as an interlayer insulating film or as a protective film, a layer with a pattern obtainable by the method for forming a pattern according to the tenth embodiment of the invention. In accordance with a twelfth embodiment of the present invention, a circuit formation substrate is provided that comprises a supporting substrate, an interlayer insulating film, a conductor film and a protective film in a sequential order, wherein at least one of the interlayer insulating film and the protective film is formed of the photosensitive resin composition according to any one of the first embodiment, the second embodiment, the third embodiment, the fourth embodiment, the fifth embodiment, the sixth embodiment, the seventh embodiment, the eighth embodiment and the ninth embodiment of the present invention. In accordance with a thirteenth embodiment of the present invention, the eleventh embodiment, of the twelfth embodiment, is further modified so that it is a suspension for a hard disc drive.

The photosensitive resin composition according to the invention is capable of forming a good pattern on a circuit formation substrate since it is improved in sensitivity and resolution even if it contains a polymer having a rigid structure with low thermal expansion properties and low hygroscopic expansion properties.

Since the sensitivity of the photosensitive resin composition is high, the method for forming a pattern according to the invention can reduce the production cost due to the reduction of pattern formation time and improved workability.

The circuit formation substrate according to the invention has an effect of high reliability since it has a pattern with a good shape and excellent properties as the interlayer insulating layer or the protective layer of a circuit.

BEST MODE FOR CARRYING OUT THE INVENTION

Figure 1:
FIG. 1 is a schematic cross-sectional view for explaining steps for forming a pattern of a photosensitive resin composition according to an embodiment of the invention.
Figure 2:
FIG. 2 is a schematic cross-sectional view for explaining steps for forming a pattern of a photosensitive resin composition according to an embodiment of the invention.

The embodiment of the photosensitive resin composition for an interlayer insulating film or a protective film of a circuit formation substrate, the method for forming a pattern using this photosensitive resin composition and the circuit formation substrate according to the invention will be explained below in detail with reference to the drawings. The embodiment is, however, not construed as limiting the scope of the invention.

Component (a) (Polymer)

In the polymer having a structural unit shown by the formula (A), $R^1$ in the formula (A) is a trivalent or tetravalent organic group. Generally, this group is a residue, other than a carboxyl group and an acid anhydride group, of tetracarboxylic acid (dianhydride) or tricarboxylic acid (anhydride) used as a raw material. It is preferred that this group be a group having an aromatic ring such as a benzene ring. Specific examples include residues of tetracarboxylic dianhydride, which will be mentioned later.

$R^2$ in the formula (A) is a divalent organic group. Generally, this group is a residue other than an amino group of diamine used as a raw material. Specific examples include residues of diamine, which will be mentioned later.

In the formula (A), n is 1 or 2. When n is 2, plural Rs may be the same or different.

R in the formula (A) is a monovalent group having a carbon-carbon unsaturated double bond or a group shown by $O^-M^+$.

$O^-M^+$ is a group formed by ionic bonding of a hydrogen or a monovalent organic group having a carbon-carbon unsaturated double bond, and oxygen. At least one of Rs is a monovalent organic group having a carbon-carbon unsaturated double bond or a group shown by $O^-M^+$ in which $M^+$ is a monovalent organic group having a carbon-carbon unsaturated double bond.

Examples of the group having a carbon-carbon unsaturated double bond include a group containing an acryloyl group, a methacryloyl group, an allyl group or the like. In respect of reactivity or the like, a group containing an acryloyl group or a methacryloyl group is preferable. Specific examples of R include a monovalent organic group such as an acryloxyalkyloxy group ($CH_2=CH-COO-R'-O-$, wherein R' is an alkylene group (an alkylene group having 1 to 10 carbon atoms, for example)), a methacryloxyalkyloxy group ($CH_2=C(CH_3)-COO-R'-O-$, wherein R' is an alkylene group (an alkylene group having 1 to 10 carbon atoms, for example), an acryloxyalkylamino group ($CH_2=CH-COO-R'-NH-$, wherein R' is an alkylene group (an alkylene group having 1 to 10 carbon atoms, for example), and a methacryloxyalkylamino group ($CH_2=C(CH_3)-COO-R'-NH-$, wherein R' is an alkylene group (an alkylene group having 1 to 10 carbon atoms, for example)). Of these, it is preferred that the group be a group obtained by allowing a compound having a carbon-carbon unsaturated double bond to form an ester bond with an adjacent CO by covalent bonding. In order to allow the compound having a carbon-carbon unsaturated double bond to form an ester bond with an adjacent carbonyl group, an alcohol having such an organic group and tetracarboxylic dianhydride constituting part of an acid part of the polymer are reacted, for example. As the group shown by $O^-M^+$ in which a compound having a carbon-carbon unsaturated double bond is subjected to ionic bonding, a group obtained by ionic bonding of dialkylaminoalkylacrylate or dialkylaminoalkylmethacrylate (for example, each alkyl has 1 to 10 carbon atoms), ($CH_2=CH-COO-R'-N^+H(C_nH_{2n+1})_2O^-$, $CH_2=C(CH_3)-COO-R'-N^+H(C_nH_{2n+1})_2O^-$ wherein n is a positive integer (for example, 1 to 10) and R' is an alkylene group (for example, an alkylene group having 1 to 10 carbon atoms)).

Of these, in respect of reactivity, it is preferred that at least one of Rs be a group shown by $O^-M^+$ in which a compound having a carbon-carbon unsaturated double bond is subjected to ionic bonding. In particular, a polymer having structural units shown by the following formula (1) is preferable.

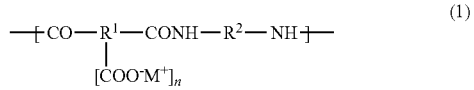

wherein $R^1$, $R^2$, $M^+$ and n are as defined in the formula (A).

The polymer shown by the above-mentioned formula (A) or the formula (1) can be obtained by the following method, for example. A polyamide acid is obtained by subjecting tetracarboxylic dianhydride and a diamine compound to addition polymerization. In order to impart the polyamide acid with photosensitivity, an amine compound having an acryloyl group or a methacryloyl group is added, followed by stirring, whereby the polyamide acid is ion bonded with the amine compound. The thus obtained polymer has a structural unit shown by the formula (A) or the formula (1), and has, without exception, an ion of a compound having an acryloyl group or a methacryloyl group in the polymer.

In the above-mentioned formula (A) or the formula (1), assuming that the number of the structural unit shown by [CO—$R^1$—CONH—$R^2$—NH] is m, there are no particular restrictions on the number m. However, it is preferred that m be 30 to 150. In the polymer, a structural unit other than the structural unit shown by the above-mentioned formula (A) or the formula (1) may be contained. However, normally, it is preferred that the polymer be composed of a structural unit shown by the above-mentioned formula (A) or the formula (1) and have a terminal group such as a hydrogen atom, an OH group or the like at the both terminals thereof. As structural units other than the structural unit shown by the formula (A) or the formula (1), a structural unit having no side chain such as COR or —COO$^-$M$^+$ or a structural unit in which all of COR and —COO$^-$M$^+$ are —COOH (carboxy group) in the formula (A) or the formula (1), or the like can be given. As for the content thereof, if the number of the structural unit other than the structural units shown by the formula (A) or the formula (1) is assumed to be t, it is preferred that t be the same or smaller than m, and it is preferred that t be 0.3 or less relative to the total of m and t.

It is preferred that the weight-average molecular weight (Mw) of the component (a) be about 10,000 to 200,000. If the component (a) contains O$^-$M$^+$, it is preferred that the weight-average molecular weight (Mw) in the state a compound having a carbon-carbon unsaturated double bond is not yet bonded by ionic bonding, i.e. in the state of a polyamide acid, be 10,000 to 90,000. Here, the Mw can be measured by the gel permeation chromatography method, and calculated by the standard polystyrene conversion.

Examples of the above-mentioned tetracarboxylic dianhydride include, though not limited thereto, pyromellitic dianhydride, 3,3',4,4'-benzophenonetetracarboxylic dianhydride, 3,3',4,4'-biphenyltetracarboxylic dianhydride, 4,4'-oxydiphthalic dianhydride, 1,2,5,6-naphthalenetetracarboxylic dianhydride, 1,4,5,8-naphthalanetetracarboxylic dianhydride, 4,4'-sulfonyldiphthalic dianhydride and 2,2-bis(3,4-dicarboxyphenyl)propane dianhydride.

Examples of the diamine compound includes, though not limited thereto, aromatic diamines such as p-phenylenediamine, m-phenylenediamine, 2,2'-dimethyl-4,4'-diaminobiphenyl, p-xylylenediamine, m-xylylenediamine, 1,5-diaminonaphthalene, benzidine, 3,3'-dimethoxybenzidine, 4,4'-(or 3,4'-, 3,3'-, 2,4'-)diaminodiphenylmethane, 4,4'-(or 3,4-, 3,3'-, 2,4'-)diaminodiphenylether, 4,4'-(or 3,4'-, 3,3'-, 2,4'-)diaminodiphenylsulfone, 4,4'-(or 3,4'-, 3,3'-, 2,4'-)diaminodiphenylsulfide, 4,4'-benzophenonediamine, 3,3'-benzophenonediamine, 4,4'-di(4-aminophenoxy)phenylsulfone, 4,4'-bis(4-aminophenoxy)biphenyl, 1,4-bis(4-aminophenoxy)benzene, 1,3-bis(4-aminophenoxy)benzene, 1,1,1,3,3,3-hexafluoro-2,2-bis(4-aminophenyl)propane, 2,2'-bis(trifluoromethyl)benzidine, 2,2-bis[4-(4-aminophenoxy)phenyl]propane, 3,3-dimethyl-4,4'-diaminodiphenylmethane, 3,3',5,5'-tetramethyl-4,4'-diaminodiphenylmethane, 4,4'-di(3-aminophenoxy)phenylsulfone, 3,3'-diaminodiphenylsulfone, 2,2'-bis(4-aminophenyl)propane, 5,5'-methylene-bis-(anthranililic acid), 3,5-diaminobenzoic acid, 3,3'-dihydroxy-4,4'-diaminobiphenyl, 3,3'-dimethyl-4,4-diaminobiphenyl, 2,2'-dimethyl-4,4'-diaminobiphenyl, and 3,3'-dimethyl-4,4'-diaminobiphenyl-6,6'-disulfonic acid; heterocyclic diamines such as 2,6-diaminopyridine, 2,4-diaminopyridine, 2,4-diamino-s-triazine, 2,7-diaminobenzofuran, 2,7-diaminocarbazole, 3,7-diaminophenothiazine, 2,5-diamino-1,3,4-thiaziazole, and 2,4-diamino-6-phenyl-s-triazine; and aliphatic diamines such as trimethylene diamine, tetramethylene diamine, hexamethylene diamine, 2,2-dimethylpropylene diamine, and diaminopolysiloxane shown by the following formula (4):

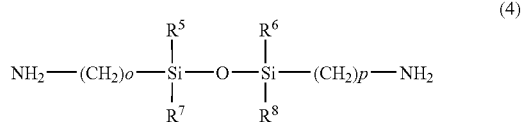

wherein $R^5$, $R^6$, $R^7$ and $R^8$ are independently an alkyl group having 1 to 6 carbon atoms, and o and p are independently an integer of 1 to 10.

Each of the tetracarboxlic dianhydride and the diamine compound as mentioned above is used singly and/or in combination of two or more.

Of the above-mentioned diamine compounds, one having a diamine residue shown by the following formula (2) or (3) is preferable since not only it gives preferred transparency as the photosensitive resin but also gives preferred low thermal expansion properties and low hygroscopic expansion properties which are preferable for use as the interlayer insulating film or the protective film of a suspension.

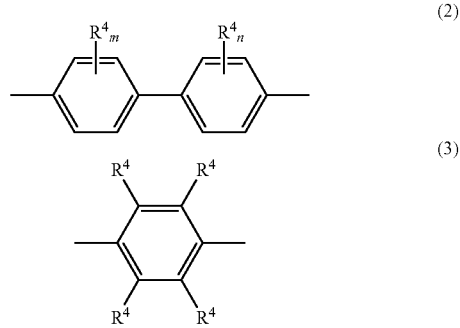

wherein plural $R^4$s are independently a fluorine atom or a monovalent organic group having 1 to 10 carbon atoms which may have an oxygen atom, a sulfur atom or a halogen atom, and m and n are independently an integer of 0 to 4.

Of these, in view of low hygroscopic expansion properties, it is preferred that $R^4$ be a group selected from a methyl group, an ethyl group, an isopropyl group, a t-butyl group, a fluorine atom and a trifluoromethyl group. It is particularly preferred that $R^4$ be a fluorine atom or a trifluoromethyl group.

Further, in the formula (2), in respect of imparting low thermal expansion properties and low hygroscopic expansion properties, it is preferred that two $R^4$s be positioned at the ortho position relative to the bond connecting two benzene rings. Of these structures, a diamine residue shown by the following formula (4) is preferable.

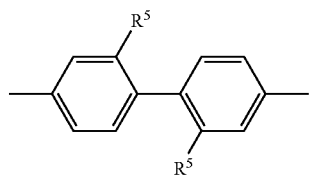

(4)

wherein $R^5$s are independently a fluorine atom or a trifluoromethyl group.

As the amine having an acryloyl group or a methacryloyl group to be added in order to impart the polyamide acid with photosensitivity, N,N-dialkylaminoalkyl (meth)acrylate such as N,N-diethylaminopropyl methacrylate, N,N-dimethylaminopropyl methacrylate, N,N-diethylaminopropyl acrylate, N,N-diethylaminoethyl methacrylate, or the like can be given. The amines are, however, not limited thereto. It is preferred that the amine having an acryloyl group or a methacryloyl group of these be added in an amount of 20 to 200 parts by mass relative to 100 parts by mass of the above-mentioned polyamide acid to form the component (a).

Component (b) (Sensitizer)

The component (b) is a compound which generates a radical by irradiation of active rays and contains a structure shown by the following formula (B):

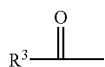

(B)

wherein $R^3$ is a monovalent aromatic or heterocyclic ring, which may have a substituent.

There are no particular restrictions on the component (b) insofar as it is a compound which has the above structure and is capable of generating a radical upon exposure to active rays.

For example, other than the compounds classified into oxime esters mentioned later, the following compounds can be given as preferable compounds.

N,N'-tetraalkyl-4,4'-diamino-benzophenone such as benzophenone and N,N'-tetramethyl-4,4'-diaminobenzophenone (Michler's ketone), aromatic ketones such as 2-benzyl-2-dimethylamino-1-(4-morpholinophenyl)-butanone-1,2-methyl-1-[4-(methylthio) phenyl]-2-morpholino-propane-1, quinines which form a condensed ring with an aromatic ring such as alkylanthraquinone, benzoin ether compounds such as benzoin alkyl ether, a benzoin compound such as benzoin and alkylbenzoin, benzyl derivatives such as benzyl dimethyl ketal or a compound shown by the following formula (10).

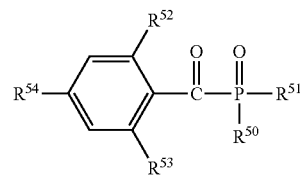

(10)

wherein $R^{50}$ is an alkyl group having 1 to 20 carbon atoms; an alkyl group having 2 to 20 carbon atoms which contains one or more oxygen atoms therein; an alkoxy group having 1 to 12 carbon atoms; a phenyl group which is substituted by an alkyl group having 1 to 4 carbon atoms; a phenyl group; a phenyl group which is substituted by an alkyl group having 1 to 20 carbon atoms, an alkoxy group having 1 to 12 carbon atoms, a halogen, a cyclopentyl group, a cyclohexyl group, an alkenyl group having 1 to 12 carbon atoms, an alkyl group having 2 to 18 carbon atoms which contains one or more oxygen atoms therein and/or an alkyl group having 1 to 4 carbon atoms; or a biphenylyl group, $R^{51}$ is a group shown by the formula (11) or the same group as the above-mentioned $R^{50}$, $R^{52}$ to $R^{54}$ are independently an alkyl group having 1 to 12 carbon atoms, an alkoxy group having 1 to 12 carbon atoms or a halogen.

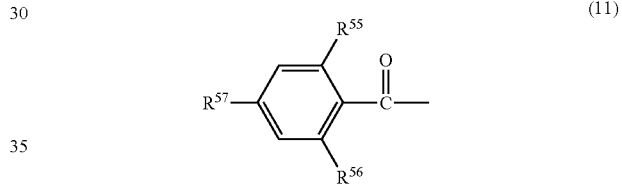

(11)

wherein $R^{55}$ to $R^{57}$ are the same as $R^{52}$ to $R^{54}$ in the above-mentioned formula (10).

Of these, oxime esters are more preferable since they are particularly improved in sensitivity, and give a significantly good pattern in a photosensitive resin composition containing a polymer having a diamine residue shown by the above-mentioned (2) or (3), in particular, a polymer containing a diamine residue shown by the formula (4). In particular, in the case of the component (a) having a diamine residue shown by the formula (4), there may be a case where good sensitivity characteristics cannot be obtained. In order to attain good sensitivity and residual film ratio in such component (a), oxime esters shown by the following formula (5) are particularly preferable.

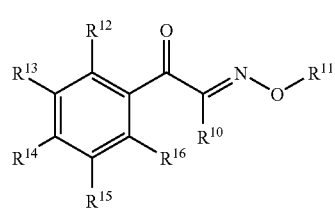

(5)

wherein $R^{10}$ to $R^{16}$ are independently a monovalent group.

As for the above-mentioned monovalent organic group, a preferable group varies depending on the substituent. The following can be given, for example.

$R^{10}$ is a phenyl group (it may be substituted by one or more of an alkyl group having 1 to 6 carbon atoms, a phenyl group, a halogen atom, —$OR^{30'}$, —$SR^{31'}$ or —$N(R^{32'})(R^{33'})$, in which $R^{30'}$ to $R^{33'}$ are an alkyl group having 1 to 20 carbon atoms), an alkyl group having 1 to 20 carbon atoms (when the number of carbon atoms of the alkyl group is 2 to 20, it may have one or more oxygen atoms between carbon atoms constituting the main chain and/or may be substituted by one or more hydroxyl groups), a cycloalkyl group having 5 to 8 carbon atoms, an alkanoyl group having 2 to 20 carbon atoms, a benzoyl group (it may be substituted by one or more of an alkyl group having 1 to 6 carbon atoms, a phenyl group, —$OR^{30'}$, —$SR^{31'}$ or —$N(R^{32'})(R^{33'})$, in which $R^{30'}$ to $R^{33'}$ are an alkyl group having 1 to 20 carbon atoms), an alkoxycarbonyl group having 2 to 12 carbon atoms (when the number of carbon atoms of the alkoxy group is 2 to 11, the alkoxy group may have one or more oxygen atoms between carbon atoms constituting the main chain and/or may be substituted by one or more hydroxyl groups), a phenoxycarbonyl group (it may be substituted by one or more of an alkyl group having 1 to 6 carbon atoms, a phenyl group, a halogen atom, —$OR^{36'}$ or —$N(R^{32'})(R^{33'})$, in which $R^{30'}$, $R^{32'}$ and $R^{33'}$ are an alkyl group having 1 to 20 carbon atoms, a cyano group, a nitro group, —$CON(R^{32'})(R^{33'})$, a haloalkyl group having 1 to 4 carbon atoms, —$S(O)m\text{-}R^{20}$ ($R^{20}$ is an alkyl group having 1 to 6 carbon atoms or an aryl group having 6 to 12 carbon atoms which may be substituted by an alkyl group having 1 to 12 carbon atoms, and m is 1 or 2), an alkoxysulfonyl group having 1 to 6 carbon atoms, an aryloxysulfonyl group having 6 to 10 carbon atoms or a diphenylphosphinoyl group.

$R^{11}$ is an alkanoyl group having 2 to 12 carbon atoms (it may be substituted by one or more of a halogen atom or a cyano group), an alkenoyl group having 4 to 6 carbon atoms of which the double bond is not conjugated with a carbonyl group, a benzoyl group (it may be substituted by one or more of an alkyl group having 1 to 6 carbon atoms, a halogen atom, a cyano group, —$OR^{30}$, —$SR^{31}$— or —$N(R^{32})(R^{33})$), an alkoxycarbonyl group having 2 to 6 carbon atoms, or a phenoxycarbonyl group (it may be substituted by one or more of an alkyl group having 1 to 6 carbon atoms or a halogen atom), $R^{12}$, $R^{13}$, $R^{14}$, $R^{15}$ and $R^{16}$ are independently a hydrogen atom, a halogen atom, an alkyl group having 1 to 12 carbon atoms, a cyclopentyl group, a cyclohexyl group or a phenyl group (it may be substituted by one or more of —$OR^{30}$, —$SR^{31}$ or —$N(R^{32})(R^{33})$, a benzyl group, a benzoyl group, an alkanoyl group having 2 to 12 carbon atoms, an alkoxycarbonyl group having 2 to 12 carbon atoms (when the number of carbon atoms is 2 to 11, the alkoxy group may have one or more oxygen atoms between carbon atoms which constitute the main chain and/or may be substituted by one or more hydroxyl groups), a phenoxycarbonyl group, —$OR^{36}$ (—$OR^{36}$ may be bonded to one of carbon atoms in the phenyl ring or the substituents for the phenyl ring to form a five- or six-membered ring), —$SR^{31}$ (—$SR^{31}$ may be bonded to one of carbon atoms in the phenyl ring or the substituents for the phenyl ring to form a five- or six-membered ring), —$S(O)R^{31}$ (—$SR^{31}$ may be bonded to one of carbon atoms in the phenyl ring or the substituents for the phenyl ring to form a five- or six-membered ring), —$SO_2R^{31}$ (—$SR^{31}$ may be bonded to one of carbon atoms in the phenyl ring or the substituents for the phenyl ring to form a five- or six-membered ring), —$N(R^{32})(R^{33})$(—$NR^{32}$ and/or —$NR^{33}$ may be bonded to one of carbon atoms in the phenyl group or in the substituent for the phenyl group to form a five- or six-membered ring), and at least one of $R^{12}$, $R^{13}$, $R^{14}$, $R^{15}$ and $R^{16}$ is —$OR^{30}$, —$SR^{31}$ or —$N(R^{32})(R^{33})$, $R^{30}$ is a hydrogen atom, an alkyl group having 1 to 12 carbon atoms, a substituted alkyl group having 2 to 6 carbon atoms {the substituent is formed of one or more of a hydroxyl group, a mercapto group, a cyano group, an alkoxyl group having 1 to 4 carbon atoms, an alkenyloxy group having 3 to 6 carbon atoms, a 2-cyanoethoxy group, a 2-(alkoxycarbonyl) ethoxy group having 4 to 7 carbon atoms, an alkylcarbonyloxy group having 2 to 5 carbon atoms, a phenylcarbonyloxy group, a carboxyl group or an alkoxycarbonyl group having 2 to 5 carbon atoms}, an alkyl group having 2 to 6 carbon atoms having one or more oxygen atoms between carbon atoms constituting the main chain, an alkanoyl group having 2 to 8 carbon atoms, —$(CH_2CH_2O)_nH$ (wherein n is an integer of 1 to 20), an alkenyl group having 3 to 12 carbon atoms, an alkenoyl group having 3 to 6 carbon atoms, a cyclohexyl group, a phenyl group (it may be substituted by a halogen atom, an alkyl group having 1 to 12 carbon atoms or an alkoxy group having 1 to 4 carbon atoms), a phenylalkyl group having 7 to 9 carbon atoms, or —$Si(R^{40})_r(R^{41})_{3-r}$ (wherein $R^{40}$ is an alkyl group having 1 to 8 carbon atoms, $R^{41}$ is a phenyl group, and r is an integer of 1 to 3);

$R^{31}$ is a hydrogen atom, an alkyl group having 1 to 12 carbon atoms, an alkenyl group having 3 to 12 carbon atoms, a cyclohexyl group, a substituted alkyl group having 2 to 6 carbon atoms {the substituent is formed of one or more of a hydroxyl group, a mercapto group, a cyano group, an alkoxyl group having 1 to 4 carbon atoms, an alkenyloxy group having 3 to 6 carbon atoms, a 2-cyanoethoxy group, a 2-(alkoxycarbonyl)ethoxy group having 4 to 7 carbon atoms, an alkylcarbonyloxy group having 2 to 5 carbon atoms, a phenylcarbonyloxy group, a carboxyl group or an alkoxycarbonyl group having 2 to 5 carbon atoms}, an alkyl group having 2 to 12 carbon atoms having one or more oxygen atoms or sulfur atoms between carbon atoms constituting the main chain, a phenyl group (it may be substituted by a halogen atom, an alkyl group having 1 to 12 carbon atoms or an alkoxyl group having 1 to 4 carbon atoms) or a phenylalkyl group having 7 to 9 carbon atoms;

$R^{32}$ and $R^{33}$ are independently are a hydrogen atom, an alkyl group having 1 to 12 carbon atoms, a hydroxyalkyl group having 2 to 4 carbon atoms, an alkoxyalkyl group having 2 to 10 carbon atoms, an alkenyl group having 3 to 5 carbon atoms, a cycloalkyl group having 5 to 12 carbon atoms, a phenylalkyl group having 7 to 9 carbon atoms, a phenyl group (it may be substituted by one or more of an alkyl group having 1 to 12 carbon atoms or an alkoxy group having 1 to 4 carbon atoms), an alkanoyl group having 2 to 3 carbon atoms, an alkenoyl group having 3 to 6 carbon atoms, or a benzoyl group, or $R^{32}$ and $R^{33}$ together form an alkylene group having 2 to 6 carbon atoms (it may have one or more oxygen atoms or —$NR^{30}$— between carbon atoms constituting the main chain and/or may be substituted by one or more of a hydroxyl group, an alkoxyl group having 1 to 4 carbon atoms, an alkanoyloxy group having 2 to 4 carbon atoms or a benzoyloxy group).

In particular, among them, one in which at least one of $R^{12}$, $R^{13}$, $R^{14}$, $R^{15}$ and $R^{16}$ is —$SR^{31}$ is preferable since it is particularly improved in sensitivity and residual film ratio.

In the formula (5), $R^{10}$ is preferably an alkyl group having 1 to 10 carbon atoms, more preferably an alkyl group having 4 to 7 carbon atoms, and particularly preferably a hexyl group. It is preferred that four of $R^{12}$ to $R^{16}$ are hydrogen and it is more preferred that $R^{12}$, $R^{13}$, $R^{15}$ and $R^{16}$ are hydrogen and the remaining is —$SR^{31}$. This —$SR^{31}$ is preferably a cyclohexyl group, a phenyl group, or a phenylalkyl group having 7 to 10 carbon atoms, more preferably a phenyl group or a phenylalkyl group having 7 to 10 carbon atoms, with a phenyl group being particularly preferable.

Further, as a compound which serves not to adversely affect a low hygroscopic expansion coefficient or often further lower such low hygroscopic expansion coefficient, which is appropriate for use in a protective film of a hard disc suspension, a compound having a structure shown by the following formula (6) is significantly preferable.

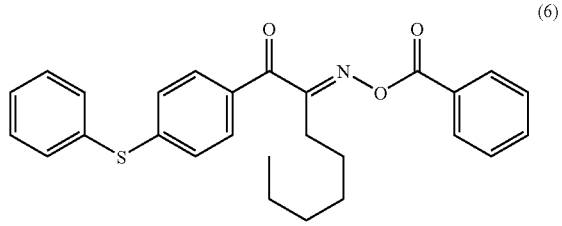

(6)

It is preferred that the above-mentioned component (b) be added in an amount of 0.1 to 20 parts by mass relative to 100 parts by mass of the above-mentioned component (a). If the amount is less than 0.1 part by mass, photosensitivity may become poor. If the amount exceeds 20 parts by mass, the mechanical properties of the film may be deteriorated. It is more preferred that the amount of the component (b) be 0.5 to 10 parts by mass.

Component (c) (Solvent)

In the invention, for synthesizing a polyamide acid and as a component of the photosensitive resin composition, a solvent is normally used. Usable solvents include acetone, methyl ethyl ketone, toluene, chloroform, methanol, ethanol, 1-propanol, 2-propanol, 1-butanol, 2-butanol, t-butanol, ethylene glycol monomethyl ether, propylene glycol monomethyl ether, xylene, tetrahydrofuran, dioxane, N,N-dimethylacetoamide, N,N-dimethylformamide, N-methyl-2-pyrrolidone, γ-butyrolactone, dimethylsulfoxide, ethylene carbonate, propylene carbonate and sulfolane. These organic solvents are used singly or in combination of two or more.

It is preferred that the component (c) be used in an amount of 100 to 500 parts by mass relative to 100 parts by mass of the above-mentioned component (a).

The photosensitive resin composition of the invention is normally provided in the form of varnish. If need arises, a sensitizer, a light-shielding agent, a polymerization inhibitor, a cross-linking agent, a dissolution accelerator, a stabilizer, an adhesion aid or the like may be added to the photosensitive resin composition.

Here, the polymerization inhibitor is used not only to improve the resolution of this photosensitive resin composition but also to enhance the storage stability thereof. Examples of such radical polymerization inhibitor or the radical polymerization suppressor include p-methoxyphenol, diphenyl-p-benzoquinone, benzoquinone, hydroquinone, pyrogallol, phenothiazine, resorcinol, orthodinitrobenzene, paradinitrobenzene, methadinitrobenzene, phenanthraquinone, N-phenyl-1-naphthylamine, N-phenyl-2-naphthylamine, cupferron, phenothiazine, 2,5-toluquinone, tannic acid, parabenzyl aminophenol and nitrosoamine. These may be used either singly or in combination of two or more.

The radical polymerization inhibitor or the radical polymerization suppressor is used preferably in an amount of 0.01 to 30 parts by mass, more preferably 0.05 to 10 parts by mass, relative to the total amount, i.e. 100 parts by mass, of the component (a). If the amount is less than 0.01 parts by mass, stability during storage may be deteriorated. An amount exceeding 30 parts by mass results in lowering of photosensitivity and mechanical properties.

As the dissolution accelerator, a sulfonamide derivative is preferable, for example. Examples of the sulfonamide derivative include benzene sulfoneamide, toluene sulfoneamide, methoxybenzene sulfoneamide, benzene sulfonylanilide, toluene sulfonylanilide, methoxy-toluenesulfonylanilide, acetyl-toluenesulfonylanilide, toluenesulfonyl-N-methylamide, toluenesulfonyl-N-ethylamide, toluenesulfonyl-N-propylamide, toluenesulfonyl-N-butylamide, toluenesulfonyl-N-phenylamide, toluenesulfonyl-N-dimethylamide, toluenesulfonyl-N-diethylamide and toluenesulfonyl-N-diphenylamide. Of these, N-phenylbenzene sulfoneamide is preferable since it is particularly effective. The amount of the dissolution accelerator is preferably 2 to 30 parts by mass, more preferably 3 to 15 parts by mass, relative to 100 parts by mass of the above-mentioned component (a).

If the amount of the dissolution accelerator is less than 2 parts by mass, the photosensitive resin is not dissolved in a developer, resulting in difficulty in forming a pattern. On the other hand, an amount exceeding 30 parts by mass is not preferable since a formed pattern becomes brittle.

For example, the composition of the invention may be formed only of the components (a) and (b) in an amount of 75 wt % or more, 85 wt % or more, 95 wt % or more or 100 wt %, excluding the component (c). In addition to these components, the composition of the invention may contain a substance which does not impair novel and basic properties of the invention such as those mentioned above as additives.

[Method for Forming a Pattern]

The method for forming a pattern according to the invention will be explained. In the method for forming a pattern according to the invention, the above-mentioned photosensitive resin composition is applied to a supporting substrate of a suspension for a hard disc drive, e.g. a stainless substrate for suspension formation, by spraying, screen printing, rotational coating, for example. Subsequently, an organic solvent in the photosensitive composition is removed by heating and drying, thereby to obtain a photosensitive resin film which is a non-sticky coating film. This coating film is irradiated with active rays in the shape of a pattern, thereby to form, for example, a through-hole pattern. As the active rays for irradiation, ultraviolet rays, far ultraviolet rays, visible rays, electronic rays, X-rays or the like can be given. After the irradiation of active rays, non-irradiated parts are removed with a suitable developer, thereby to obtain a desired relief pattern.

Although there are no particular restrictions on the type of a developer, a fire-resistant solvent such as 1,1,1-trichloroethane, an aqueous alkaline solution such as an aqueous solution of sodium carbonate and an aqueous solution of tetramethylammonium hydroxide, a good solvent such as N,N-dimethylformamide, dimethylsulfoxide, N,N-dimethylacetoamide, N-methyl-2-pyrrolidone and γ-butyrolactone, and a mixed solvent of these good solvents with a poor solvent such as a lower alcohol, water and aromatic hydrocarbon. After the development, rinsing is conducted with a poor solvent or the like if need arises.

A relief pattern obtained by the above-mentioned process is heated at 80 to 400° C. for 5 to 300 minutes, for example, to allow the ring closing of the imide, thereby to obtain a polyimide pattern.

The method for forming a pattern according to the invention can shorten the time required for forming a pattern, resulting in an improved workability since the sensitivity of the photosensitive resin film is high. In addition, the production cost can also be reduced.

Subsequently, as one example of the method for forming a pattern according to the invention, a process in which a pattern is formed on a suspension of a hard disc drive will be explained below with reference to the drawings.

Figure 3:
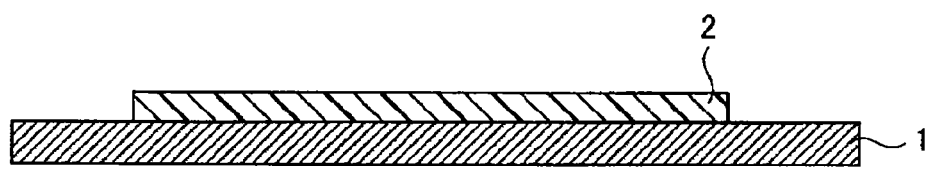
FIG. 3 is a schematic cross-sectional view for explaining steps for forming a pattern of a photosensitive resin composition according to an embodiment of the invention.

FIGS. 1 to 9 are schematic cross-sectional views for explaining a process for forming a photosensitive resin pattern. In these FIGS. 1 to 9, for example, stainless foil is prepared as a supporting substrate 1 constituting a suspension (FIG. 1). Subsequently, on this supporting substrate 1, the above-mentioned photosensitive resin composition is applied by means of a spin coater or the like (FIG. 2), followed by exposure and development to form an insulating layer 2 (FIG. 3).

Figure 4:
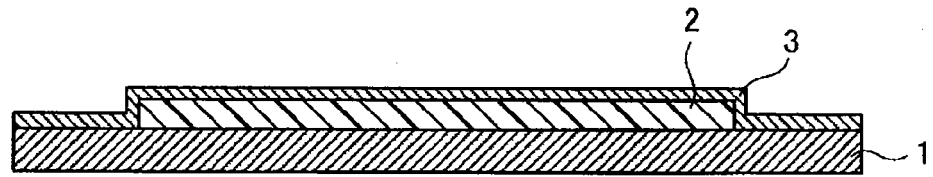
FIG. 4 is a schematic cross-sectional view for explaining steps for forming a pattern of a photosensitive resin composition according to an embodiment of the invention.
Figure 5:
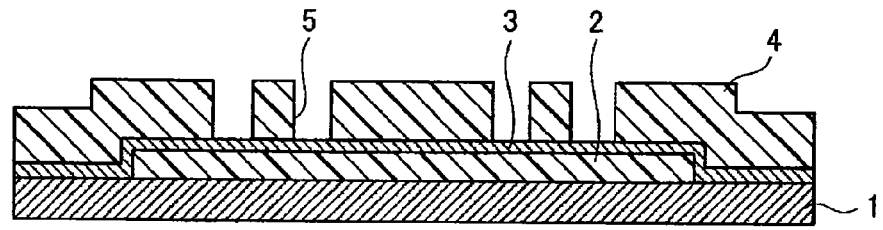
FIG. 5 is a schematic cross-sectional view for explaining steps for forming a pattern of a photosensitive resin composition according to an embodiment of the invention.
Figure 6:
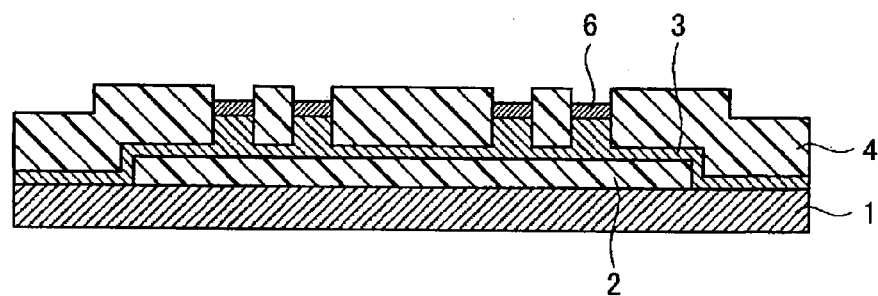
FIG. 6 is a schematic cross-sectional view for explaining steps for forming a pattern of a photosensitive resin composition according to an embodiment of the invention.

Subsequently, in order to allow a plated film to grow on the insulating layer 2, which is an insulator, a seed layer 3 is formed as a backing metal layer (FIG. 4). As the seed layer 3, two layers of a chromium thin film and a copper thin film can be formed by a high-frequency sputtering method or the like. Subsequently, a resist (photosensitive resin composition) 4 is applied to the seed layer 3, and the resultant is exposed to light with a prescribed pattern, followed by development (FIG. 5). In an opening 5 of a resist pattern, a multilayer circuit conductor of copper, nickel, gold or the like is sequentially stacked by electroplating, thereby to form a circuit layer 6 (FIG. 6).

Figure 7:
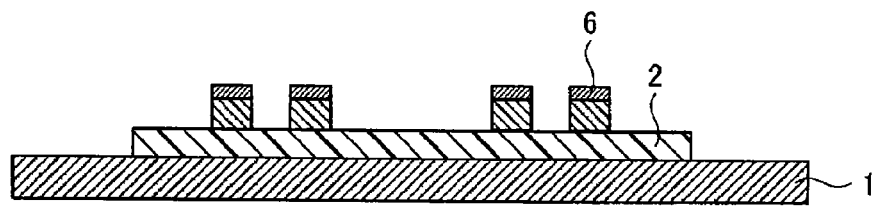
FIG. 7 is a schematic cross-sectional view for explaining steps for forming a pattern of a photosensitive resin composition according to an embodiment of the invention.
Figure 8:
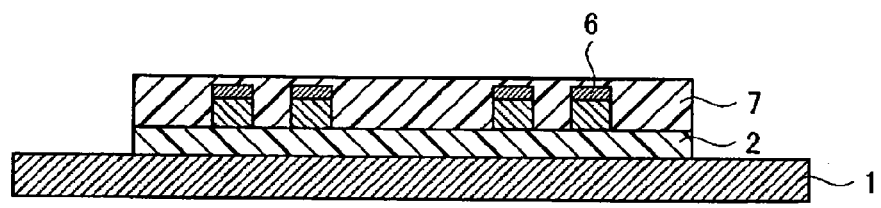
FIG. 8 is a schematic cross-sectional view for explaining steps for forming a pattern of a photosensitive resin composition according to an embodiment of the invention.
Figure 9:
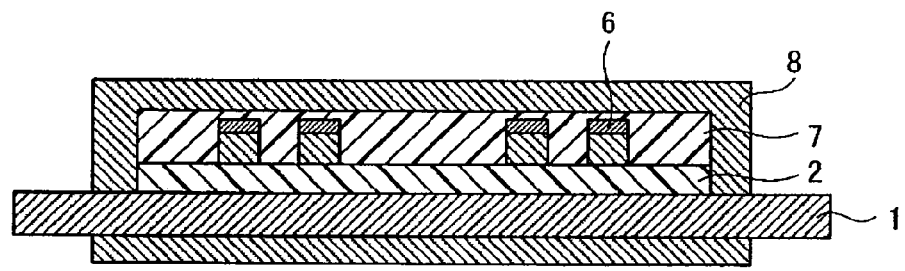
FIG. 9 is a schematic cross-sectional view for explaining steps for forming a pattern of a photosensitive resin composition according to an embodiment of the invention.

After the circuit layer 6 is formed, the resist 4 is peeled off, and the seed layer 3 is removed by etching (FIG. 7). Subsequently, in order to protect the circuit layer 6, the same photosensitive resin composition as mentioned above is applied to the circuit layer 6, followed by exposure and development, thereby to form a protective layer 7 (FIG. 8). Thereafter, a cover 8 for covering a prescribed part of the protective layer 7 and the supporting substrate 1 is provided, whereby gimbal can be formed (FIG. 9).

[Circuit Formation Substrate]

The photosensitive resin composition according to the invention is used for forming a pattern by the above-mentioned method for forming a pattern. The resulting pattern is used as an interlayer insulating film or a protective film of a circuit formation substrate such as a suspension for a hard disc drive and a flexible circuit board. In particular, the photosensitive resin composition of the invention is used as a material for an interlayer insulating film formed on a metal substrate such as a stainless substrate of a suspension for a hard disc drive or as a material for forming a film for protecting electric signal lines formed on the metal substrate or the resin substrate.

For example, the suspension for a hard disc drive according to the invention includes a supporting substrate such as stainless steel, an interlayer insulating film obtainable by the above-mentioned photosensitive resin composition, a conductive layer such as a copper layer, and a protective layer obtainable by the photosensitive resin composition in a sequential order. On the interlayer insulating film, a copper layer may be formed through a chromium layer or a titanium layer.

Figure 10:
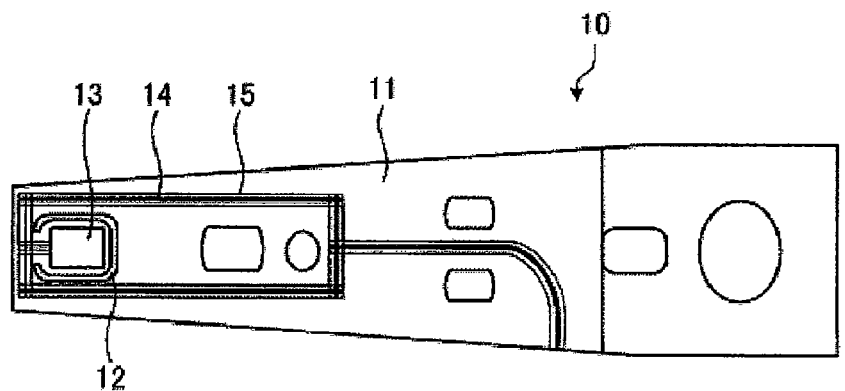
FIG. 10 is a schematic plan view showing a suspension for a hard disc drive using a photosensitive resin composition in an embodiment of the invention.

FIG. 10 is a schematic plan view showing one example of a suspension of a hard disc drive in which a pattern is formed using the photosensitive resin composition according to the invention. In FIG. 10, a suspension 10 is provided with a magnetic head having a function of writing and reading data to a magnetic disc and serves to control a gap between the magnetic disc and the magnetic head to several tens nanometers with a high degree of accuracy. The suspension 10 is formed of a plate-like member 11 which is made of stainless steel or the like. At the tip of the plate-like member 11 constituting the suspension 10, the gimbal 13 is integrally formed by a notch 12. On the gimbal 13, a slider (not shown) having a magnetic head is fixed.

On the plate-like member 11, an insulating layer (not shown) made from the photosensitive resin composition is formed. A prescribed pattern circuit formed of a copper conductor layer 14 is mounted thereon. Further, a protective layer 15 made from the photosensitive resin composition is formed. Since a prescribed pattern circuit is mounted on the plate-like member 11, this suspension 10 is called the so-called "suspension with a circuit".

The photosensitive resin composition of the invention can be used for the insulating layer or the protective film.

EXAMPLES

The invention will be explained in more detail according to Examples and Comparative Examples, which should not be construed as limiting the scope of the invention.

Synthesis Example 1

Synthesis of Polyamide Acid

To 150 ml of N-methyl-2-pyrrolidone, 5.4 g (50 mmol) of p-phenylenediamine and 16.0 g (50 mmol) of 2,2'-bis(trifluoromethyl)benzidine were added and dissolved. Thereafter, 29.4 g (100 mmol) of 3,3',4,4'-biphenyltetracarboxlic dianhydride was added to allow the resultant to be polymerized, whereby a polyamide acid with a weight average molecular weight calculated by a standard polystyrene conversion of 41,400 was obtained. This is referred to as a polymer solution I.

Synthesis Example 2

Synthesis was conducted in the same manner as in Synthesis Example 1 except that 2,2'-bis(trifluoromethyl)benzidine used in Synthesis Example 1 was replaced by an equivalent molar amount of 2,2'-dimethylbenzidine.

As a result of a standard polystyrene conversion, the resulting polyamide acid had a weight average molecular weight of 51,500. This is referred to as a polymer solution II.

Synthesis Example 3

Synthesis was conducted in the same manner as in Synthesis Example 1 except that 2,2'-bis(trifluoromethyl)benzidine used in Synthesis Example 1 was replaced by an equivalent molar amount of 2,3,5,6-tetramethyl-1,4-phenylenediamine.

As a result of a standard polystyrene conversion, the resulting polyamide acid had a weight average molecular weight of 36,100. This is referred to as a polymer solution III.

Synthesis Example 4

Synthesis was conducted in the same manner as in Synthesis Example 1 except that p-phenylenediamine used in Synthesis Example 1 was replaced by an equivalent molar amount of 2,2'-bis(trifluoromethyl)benzidine.

As a result of a standard polystyrene conversion, the resulting polyamide acid had a weight average molecular weight of 47,900. This is referred to as a polymer solution IV.

Synthesis Example 5

Synthesis was conducted in the same manner as in Synthesis Example 1 except that 3,3',4,4'-biphenyltetracarboxlic dianhydride used in Synthesis Example 1 was replaced by an equivalent molar amount of pyromellitic dianhydride and p-phenylenediamine was replaced by an equivalent molar amount of 2,2'-dimethylbenzidine.

As a result of a standard polystyrene conversion, the resulting polyamide acid had a weight average molecular weight of 38,900. This is referred to as a polymer solution V.

Synthesis Example 6

Synthesis of Polyimideamide Acid Ester

In a 0.2 l-capacity flask provided with a stirrer and a thermometer, 29.4 g (100 mmol) of 3,3',4,4'-biphenyltetracarboxylic dianhydride and 28.6 g (220 mmol) of 2-hydroxyethyl methacrylate were dissolved in 100 g of N-methylpyrrolidone. Then, 1,8-diazabicycloundecene was added in a catalytic amount, and the resultant was heated at 60° C. for 2 hours, and then stirred for 15 hours at room temperature (25° C.) to conduct esterification. Thereafter, while cooling on ice, 25.9 g (220 mmol) of thionyl chloride was added. Then, the temperature was returned to room temperature, and the reaction was conducted for 2 hours, thereby to obtain a solution of an acid chloride. Subsequently, a 1 l-capacity flask provided with a stirrer and a thermometer was charged with 150 g of N-methylpyrrolidone. Then, 10.6 g (50 mmol) of 2,2'-dimethylbenzidine and 16.0 g (50 mmol) of 2,2'-bis(trifluoromethyl)benzidine were added, followed by stirring for dissolution. Then, 26.2 g (220 mmol) of pyridine was added. While keeping the temperature at 0 to 5° C., the acid chloride solution which had been in advance was added dropwise over a period of 30 minutes, and the resultant was stirred for 30 minutes. This reaction liquid was added dropwise to distilled water. A precipitate was collected by filtration and dried under reduced pressure to obtain a polyamide acid ester. As a result of a standard polystyrene conversion, the resulting polyamide acid ester had a weight average molecular weight of 19,400. This is referred to as a polymer VI. A polymer solution obtained by dissolving 100 parts by mass of polymer VI in 300 parts by mass of N-methyl-2-pyrrolidone is referred to as a polymer solution VI.

Examples 1 to 13

1. Preparation of a Photosensitive Resin Composition

To the polymer solutions I to V shown in Table 1, N,N-dimethylaminopropyl methacrylate (DAPM) was added in an equivalent molar amount as that of the carboxy group of the amide acid used. Further, as the component (b), a prescribed amount of a sensitizer shown in Table 1 was added, followed by stirring, whereby photosensitive resin solutions were obtained. The numeral value of the component (b) in the parenthesis in Table 1 is the part by mass of the component (b) when the mass of the polyamide acid in the polymer solution is taken as 100.

As for the polymer solution VI, the component (b) alone was used and stirred similarly to obtain a photosensitive resin solution.

TABLE 1

|  | Component (a) + (c) | Component (b) |
| --- | --- | --- |
| Example 1 | Polymer solution I + DAPM | B1 (3) |
| Example 2 | Polymer solution I + DAPM | B2 (5) |
| Example 3 | Polymer solution II + DAPM | B1 (3) |
| Example 4 | Polymer solution II + DAPM | B3 (5) |

TABLE 1-continued

|  | Component (a) + (c) | Component (b) |
| --- | --- | --- |
| Example 5 | Polymer solution III + DAPM | B2 (5) |
| Example 6 | Polymer solution III + DAPM | B4 (5) |
| Example 7 | Polymer solution IV + DAPM | B1 (5) |
| Example 8 | Polymer solution IV + DAPM | B2 (5) |
| Example 9 | Polymer solution IV + DAPM | B4 (5) |
| Example 10 | Polymer solution V + DAPM | B1 (5) |
| Example 11 | Polymer solution V + DAPM | B3 (5) |
| Example 12 | Polymer solution VI | B1 (5) |
| Example 13 | Polymer solution VI | B4 (5) |

B1: A compound having a structure shown by the formula (6)
B2: DAROCUR TPO (2,4,6-trimethylbenzoyl-diphenyl-phosphine oxide) manufactured by Ciba Specialty Chemicals
B3: Benzyl dimethyl ketal
B4: IRGACURE OXE-02 (ethanone-1-[9-ethyl-6-(2-methylbenzoyl)-9H-carbazole-3-yl]-1-(o-acetyloxime)

2. Evaluation of the Photosensitive Resin Composition 2-1. Photosensitivity and Resolution The resulting photosensitive resin composition was applied to a stainless substrate by rotational coating, and dried on a hot plate at 90° C. for 3 minutes, whereby a photosensitive resin film with a film thickness of 12 μm was obtained. This photosensitive resin film was exposed to light by means of a high-pressure mercury lamp through a photomask. Subsequently, the film was then heated on a hot plate at 110° C. for 1 minute, and immediately immersed in a developer of N-methyl-2-pyrrolidone to allow unexposed parts to be dissolved.

After the unexposed parts were completely dissolved, the substrate was taken out of the developer, and rinsed with isopropyl alcohol. Evaluation was made on the minimum exposure amount (sensitivity) which was required for the formation of a pattern, i.e. which allows a film in the exposed part to be dissolved in an amount of less than 10%, as well as the minimum value of the mask dimension in an opening in the form of a square hole as resolution. The results are shown in Table 2.

TABLE 2

|  | Sensitivity mJ·cm$^{-2}$ | Resolution μm |
| --- | --- | --- |
| Example 1 | 100 | 5 |
| Example 2 | 250 | 7 |
| Example 3 | 200 | 7 |
| Example 4 | 300 | 6 |
| Example 5 | 350 | 7 |
| Example 6 | 250 | 6 |
| Example 7 | 100 | 7 |
| Example 8 | 250 | 6 |
| Example 9 | 150 | 7 |
| Example 10 | 150 | 6 |
| Example 11 | 200 | 5 |
| Example 12 | 100 | 6 |
| Example 13 | 150 | 6 |

2-2. Thermal Expansion Coefficient and Hygroscopic Expansion Coefficient

The resulting photosensitive resin composition was applied to silicon wafer by spin coating, and the resultant was heated at 90° C. for 3 minutes, whereby a coating film with a thickness of 20 μm was formed.

Thereafter, the coating film was heated in an inert gas oven in a nitrogen atmosphere at 200° C. for 30 minutes. The film was further heated at 350° C. for one hour to obtain a cured film. The cured film was immersed in an aqueous solution of hydrofluoric acid together with a silicon substrate. The cured film was peeled off from the substrate, rinsed and dried. Thereafter, the thermal expansion coefficient and the hygroscopic expansion coefficient were measured by the following method. The results are shown in Table 3.

(1) Thermal Expansion Coefficient

The film which had been peeled off was cut into a width of 2 mm and a length of 20 mm to obtain a specimen for evaluation. By using a thermomechanical analyzer (TMA/SS6000 manufactured by Seiko Instruments Inc.), an average coefficient of linear expansion between 100 to 200° C. at a heating rate of 5° C./min and a tensile load of 10 g/0.02 mm$^2$ was measured.

(2) Hygroscopic Expansion Coefficient

The film which had been peeled off was cut into a width of 5 mm and a length of 20 mm to obtain a specimen for evaluation. By using a thermomechanical analyzer (TMA8310 manufactured by Rigaku Corp.), a hydroscopic expansion coefficient was measured under water vapor atmosphere. The specimen was kept at a temperature of 25° C. and a humidity of 20% RH for 2 hours for stabilization. Subsequently, the specimen was kept at a humidity of 80% RH, and this state was maintained for 1 hour until the specimen was stabilized. A difference in specimen length was divided by a variation in humidity, thereby to obtain a hydroscopic expansion coefficient (tensile load: 25 g/0.05 mm$^2$).

TABLE 3

|  | Thermal expansion coefficient ppm · K$^{-1}$ | Hygroscopic expansion coefficient ppm · %$^{-1}$ |
|---|---|---|
| Example 1 | 16 | 10 |
| Example 2 | 15 | 14 |
| Example 3 | 18 | 14 |
| Example 4 | 18 | 16 |
| Example 5 | 12 | 15 |
| Example 6 | 13 | 14 |
| Example 7 | 19 | 9 |
| Example 8 | 17 | 14 |
| Example 9 | 18 | 11 |
| Example 10 | 12 | 9 |
| Example 11 | 11 | 13 |
| Example 12 | 16 | 11 |
| Example 13 | 16 | 15 |

As shown in Table 3, in Examples 1 to 13, a cured film with a low thermal expansion and a low hygroscopic expansion could be obtained. Further, when B1 was used as the component (b), better results were obtained with a further lower hygroscopic expansion coefficient.

2-3. Warping

The resulting photosensitive composition was applied to a stainless plate (SUS 304 with a thickness of 20 μm) by means of an applicator. The resultant was dried by heating in an oven at 105° C. for 4 minutes, whereby a coating film with a thickness of about 20 μm was formed. The film, together with the substrate, was cut into an 8 cm×8 cm square. The film which had been cut was heated in an inert gas oven in a nitrogen atmosphere at 200° C. for 30 minutes. Thereafter, the film was heated at 350° C. for 1 hour to cause the film to be cured.

The center of the substrate was pushed to a plane surface, and the degree of warping was measured for the four corners of the stainless plate. The average value of the thus measured warping degrees was taken as warping. A stainless plate of which the four corners were warped in the direction of the coating surface was indicated as + and a stainless plate of which the four corners were warped in the direction opposite to the coating surface was indicated as −. The results are shown in Table 4.

TABLE 4

|  | Warping of stainless plate mm |
|---|---|
| Example 1 | 1 |
| Example 3 | 1 |
| Example 6 | −1 |
| Example 7 | 2 |
| Example 9 | 1 |
| Example 10 | −2 |
| Example 12 | 0 |

As shown in the table, each of the stainless plates underwent warping within a range of ±2 mm, which was preferable for use as a suspension for a hard disc drive.

Comparative Synthesis Example 1

Synthesis was conducted in the same manner as in Synthesis Example 1, except that the 3,3',4,4'-biphenyltetracarboxlic dianhydride used in Synthesis Example 1 was replaced by an equivalent molar amount of oxydiphthalic anhydride and all of the amine components were replaced by an equivalent molar amount of 4,4'-diaminodiphenyl ether.

As a result of a standard polystyrene conversion, the resulting polyamide acid had a weight average molecular weight of 51,100. This is referred to as a polymer solution VII.

Comparative Examples 1 to 5

To the polymer solutions I, III, V and VII, N,N-dimethylaminopropyl methacrylate (DAPM) was added in an equivalent molar amount as that of the carboxy group of the amide acid used. Further, a component (b') different from the component (b) was added (or no component was added) as shown in Table 5, followed by stirring, whereby photosensitive resin solutions were obtained.

TABLE 5

|  | Components (a) + (c) | Component (b') |
|---|---|---|
| Comparative Example 1 | Polymer solution I + DAPM | None |
| Comparative Example 2 | Polymer solution I + DAPM | B5 |
| Comparative Example 3 | Polymer solution III + DAPM | B5 |
| Comparative Example 4 | Polymer solution V + DAPM | B5 |
| Comparative Example 5 | Polymer solution VII + DAPM | B5 |

B5: 2 parts by mass of bis(cyclopentadienyl)bis(2,6-difluoro-3(1H-pir-yl)phenyl) titanium and 0.5 part by mass of diethylamino-3-thenoylcumarin were used in combination.

An evaluation was made in the same manner as in Examples. The results are shown in Tables 6 and 7.

TABLE 6

|  | Sensitivity mJ · cm$^{-2}$ | Resolution μm | Thermal expansion coefficient ppm · K$^{-1}$ | Hygroscopic expansion coefficient ppm · %$^{-1}$ |
|---|---|---|---|---|
| Comparative Example 1 | No pattern was obtained. |  | 16 | 15 |
| Comparative Example 2 | >1000 | >30 | 18 | 19 |

TABLE 6-continued

|  | Sensitivity mJ·cm$^{-2}$ | Resolution μm | Thermal expansion coefficient ppm·K$^{-1}$ | Hygroscopic expansion coefficient ppm·%$^{-1}$ |
|---|---|---|---|---|
| Comparative Example 3 | 600 | 15 | 12 | 18 |
| Comparative Example 4 | >1000 | >30 | 12 | 20 |
| Comparative Example 5 | 500 | 15 | 35 | 44 |

As shown in Table 6, when a component different from the component (b) was used, a sufficient sensitivity could not be obtained. In particular, in Comparative Examples 2 and 4 in which the polymer has a fluorine-substituted benzidine skeleton shown by the formula (4), the residual film ratio (film thickness of an exposed part after development/film thickness of an exposed part before development) was significantly low when a component different from the component (b) was used. Specifically, although a pattern was obtained when exposure was conducted at 1000 mJ/cm$^2$ or more, the residual film ratio was 30 to 60%, which was too low to be put into practice.

In Comparative Examples 2 and 4, the hygroscopic expansion coefficient of the cured film was larger than that in Comparative Examples 1 and 3, which was not suitable for use in an interlayer insulating film or a protective film of a suspension for a hard disc drive.

TABLE 7

|  | Warping of stainless plate mm |
|---|---|
| Comparative Example 1 | 4 |
| Comparative Example 5 | >15 (plate was rounded, and no accurate measurement could be conducted) |

As shown in Table 7, the stainless plates of Comparative Examples 1 and 5 underwent significant warping as compared with those of Examples.

Although some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification are incorporated herein by reference in its entirely.

The invention claimed is:

1. A photosensitive resin composition for an interlayer insulating film or a protective film of a substrate for circuit formation, wherein the photosensitive resin composition comprises:

a polymer (a) having a structural unit shown by the formula (A),

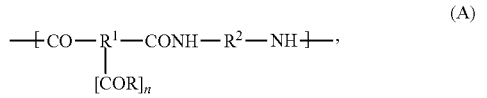

(A)

wherein R$^1$ is a trivalent or tetravalent organic group, R$^2$ is a divalent organic group, R is a monovalent organic group having a carbon-carbon unsaturated double bond or a group shown by O$^-$M$^+$, in which M$^+$ is a hydrogen ion or an ion of a compound having a carbon-carbon unsaturated double bond, and at least one of Rs is a monovalent organic group having a carbon-carbon unsaturated double bond or a group shown by O$^-$M$^+$, in which M$^+$ is an ion of a compound having a carbon-carbon unsaturated double bond, and n is 1 or 2, wherein the polymer (a) has a structural unit shown by the following formula (1),

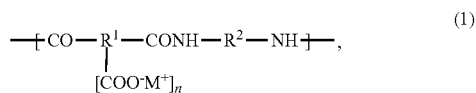

(1)

wherein R$^1$, R$^2$, M$^+$ and n are as defined in the formula (A); and a compound (b) that generates a radical when irradiated with active rays and that has a structure shown by the following formula (B),

(B)

wherein R$^3$ is a monovalent aromatic or heterocyclic ring that may have a substituent.

2. The photosensitive resin composition according to claim 1, wherein, in the structural unit shown by the formula (A), R$^2$ is a structure shown by the following formula (2) or (3),

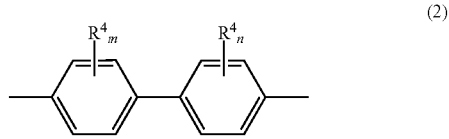

(2)

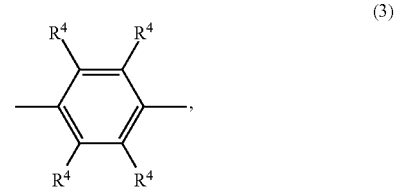

(3)

wherein a plurality of $R^4$s are independently a fluorine atom or a monovalent organic group having 1 to 10 carbon atoms that may have an oxygen atom, a sulfur atom or a halogen atom, and m and n are independently an integer of 0 to 4.

3. The photosensitive resin composition according to claim 1, wherein, in the structural unit shown by the formula (A), $R^2$ is a structure shown by the following formula (4),

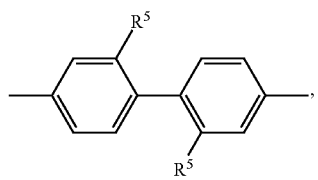

(4)

wherein $R^5$s are independently a fluorine atom or a trifluoromethyl group.

4. The photosensitive resin composition according to claim 1, wherein the compound (b) is a compound containing an oxime ester structure.

5. The photosensitive resin composition according to claim 4, wherein the compound (b) is shown by the following formula (5),

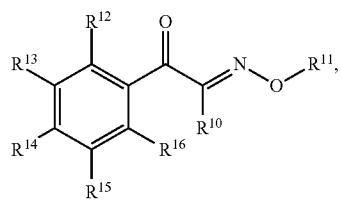

(5)

wherein $R^{10}$ to $R^{16}$ are independently a monovalent group.

6. The photosensitive resin composition according to claim 5, wherein the compound (b) is shown by the following compound (6),

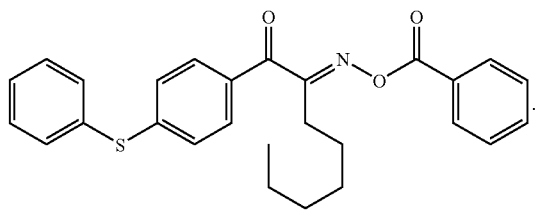

(6)

7. The photosensitive resin composition according to claim 1, wherein the compound (b) is contained in an amount of 0.1 to 20 parts by mass relative to 100 parts by mass of the polymer (a).

8. The photosensitive resin composition according to claim 1, wherein the substrate for circuit formation is a supporting substrate of a suspension for a hard disk drive.

9. A method for forming a pattern comprising the steps of:
applying the photosensitive resin composition according to claim 1 to a substrate for circuit formation, followed by drying to form a photosensitive resin film;
exposing the photosensitive resin film to light;
developing the photosensitive resin film after the exposure; and
heating the photosensitive resin film after the development.

10. A circuit formation substrate that comprises, as an interlayer insulating film or as a protective film, a layer with a pattern obtainable by the method for forming a pattern according to claim 9.

11. A circuit formation substrate that comprises a supporting substrate, an interlayer insulating film, a conductor film and a protective film in a sequential order, wherein at least one of the interlayer insulating film and the protective film is formed of the photosensitive resin composition according to claim 1.

12. The circuit formation substrate according to claim 10, wherein the circuit formation substrate is a suspension for a hard disc drive.

* * * * *

UNITED STATES PATENT AND TRADEMARK OFFICE
CERTIFICATE OF CORRECTION

PATENT NO. : 8,304,160 B2  
APPLICATION NO. : 12/759475  
DATED : November 6, 2012  
INVENTOR(S) : Tomonori Minegishi et al.

Page 1 of 1

It is certified that error appears in the above-identified patent and that said Letters Patent is hereby corrected as shown below:

Title Page, Item 73 Assignee should read

Hitachi Chemical DuPont MicroSystems, Ltd., Tokyo (JP)

Signed and Sealed this  
Seventh Day of May, 2013

Teresa Stanek Rea  
*Acting Director of the United States Patent and Trademark Office*